United States Patent
Koyama et al.

[11] Patent Number: 5,837,057
[45] Date of Patent: Nov. 17, 1998

[54] FILM FORMING APPARATUS WITH PARTICLE PREVENTION PLATE

[75] Inventors: Shuji Koyama, Kawasaki; Yukio Kawajiri, Yokohama; Makoto Shibata, Kawasaki; Manabu Sueoka, Yokohama; Toshio Suzuki, Inagi; Hisashi Yamamoto, Machida; Takumi Suzuki, Yokohama, all of Japan

[73] Assignee: Canon Kabushiki Kaisha, Tokyo, Japan

[21] Appl. No.: 635,786

[22] Filed: Apr. 22, 1996

Related U.S. Application Data

[63] Continuation of Ser. No. 169,991, Dec. 16, 1993, abandoned.

[30] Foreign Application Priority Data

Dec. 21, 1992 [JP] Japan .................................. 4-340758

[51] Int. Cl.⁶ .......................... C23C 16/00; C23C 14/24; C23C 14/34
[52] U.S. Cl. .................. 118/723 VE; 118/715; 204/298.11
[58] Field of Search ............................ 118/715, 723 VE; 204/298.11, 298.12, 298.14

[56] References Cited

U.S. PATENT DOCUMENTS

| | | | |
|---|---|---|---|
| 3,514,391 | 5/1970 | Hablanian | 204/298 |
| 4,112,196 | 9/1978 | Selig et al. | 428/594 |
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,723,129 | 2/1988 | Endo et al. | 346/1.1 |
| 4,740,796 | 4/1988 | Endo et al. | 346/1.1 |
| 5,065,698 | 11/1991 | Koike | 118/719 |
| 5,135,629 | 8/1992 | Sawada | 204/192.12 |
| 5,614,071 | 3/1997 | Mahvan et al. | 204/298.11 |
| 5,711,813 | 1/1998 | Kadoiwa et al. | 118/723 VE |

FOREIGN PATENT DOCUMENTS

| | | |
|---|---|---|
| A 0320192 | 6/1989 | European Pat. Off. . |
| A 0518467 | 12/1992 | European Pat. Off. . |
| 59-123670 | 7/1984 | Japan . |
| 59-138461 | 8/1984 | Japan . |
| 4289159 | 10/1992 | Japan ............................ 204/298.11 |
| 1 130341 | 10/1968 | United Kingdom . |

OTHER PUBLICATIONS

G. Horky, Evaporator–Sputter Shield, IBM Technical Disclosure Bulletin vol. 23 No. 6. Nov. 1980.
Patent Abstracts of Japan, vol. 007, No. 285 (C–201) Dec. 20, 1983.
Patent Abstracts of Japan, vol. 015, No. 100 (C–0813) Mar. 11, 1991.
Patent Abstracts of Japan, vol. 15, No. 353 (C–0865), Sep. 6, 1991.
Patent Abstracts of Japan, vol. 10, No. 182 (C–356), Feb. 12, 1986.

*Primary Examiner*—R. Bruce Breneman
*Assistant Examiner*—Jeffrie R Lund
*Attorney, Agent, or Firm*—Fitzpatrick, Cella, Harper & Scinto

[57] ABSTRACT

A film-forming apparatus is provided with a particle prevention means, whose structure prevents a drop in film-yield due to particle formation. The particle prevention means does not need to be cleaned as frequently as known particle prevention means, thus increasing film production efficiency. This particle prevention means has a tongued-and-grooved surface. When the particle prevention means having a tongued-and-grooved surface is set in the film-forming apparatus, the film-forming material is deposited in a discontinuous manner on the particle prevention means, which can extend the time of film exfoliation, and in turn, extend the cycle for cleaning the particle prevention means, and prevent a drop in film-yield due to the film exfoliation.

7 Claims, 10 Drawing Sheets

FIG. 1 PRIOR ART
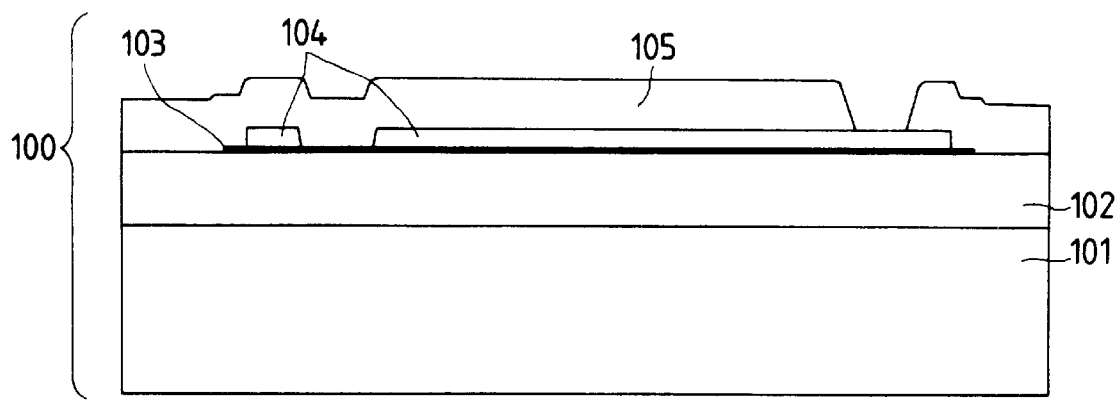
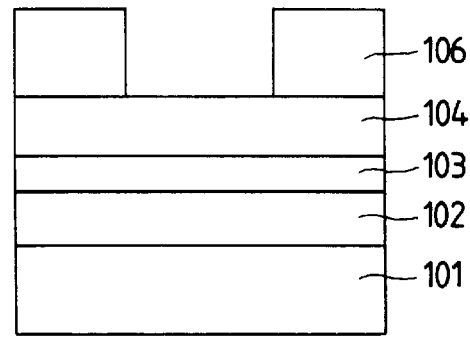
FIG. 2A
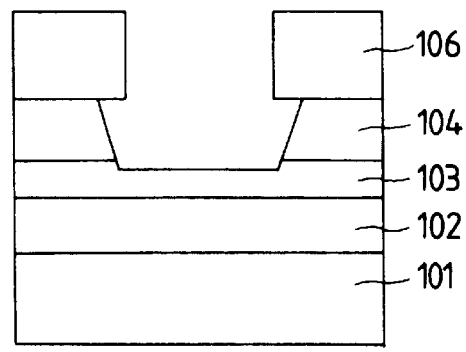
FIG. 2B
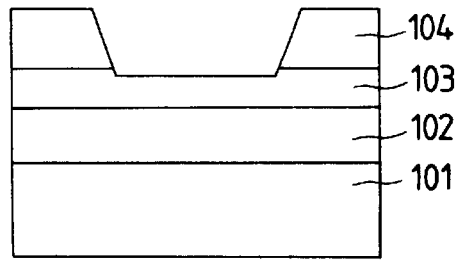
FIG. 2C

EVACUATION

FILM FORMING APPARATUS WITH PARTICLE PREVENTION PLATE

This application is a continuation of application Ser. No. 08/169,991 filed Dec. 16, 1993, which is now abandoned.

BACKGROUND OF THE INVENTION

1. Field of the Invention

The present invention relates to a method for producing a thin film resistor, a particle prevention plate for film-forming apparatus, and a film-forming apparatus having the particle prevention plate. More particularly, the invention relates to a thin film resistor which can be used as a heating resistor element in a liquid jet head for ejecting ink or the like from a discharge port utilizing thermal energy, a particle prevention plate for a film-forming apparatus suitably used in producing the thin film resistor, and a film-forming apparatus having the particle prevention plate.

2. Related Background Art

A thin film resistor is used, for example, in a liquid jet head for ejecting a liquid such as ink from a discharge port utilizing thermal energy. An example of a known layer structure for such a thin film resistor is a laminate in which a heat storage insulating layer, a heating resistor layer, a conductive wiring material layer electrically connected to the heating resistor layer, and an insulating protective layer (passivation film) are consecutively laminated on a silicon substrate.

FIG. 1 is a schematic cross section to show an example of a base for a thin film resistor having the above structure. In FIG. 1, reference numeral 101 designates a silicon substrate, 102 a heat storage insulating layer of silicon oxide, 103 a heating resistor layer, 104 a wiring material layer mainly containing aluminum, and 105 an insulating protective layer made of silicon oxide, which constitutes a base 100 for a thin film resistor.

The etching process has been used heretofore for forming a pattern of aluminum wiring electrodes in a desired layout.

An example of pattern formation is described below, referring to the schematic cross sections shown in FIGS. 2A to 2C.

A laminate is prepared first by consecutively laminating the heat storage layer 102, the heating resistor layer 103 and the electrode material layer 104 on the substrate 101 by the sputtering method or the CVD method in a film-forming apparatus. Then, positive photoresist 106 (for example OFPR-800 supplied by TOKYO OHKA KOGYO CO., LTD.) is applied in a desired thickness (for example 2 $\mu$m) to the surface of the wiring material layer 104, for example, of Al deposited over the entire upper surface of the laminate. After that, patterning is carried out for forming electrodes under irradiation of light (FIG. 2A). Subsequently, exposed portions of the wiring material layer 104 are etched with an etchant (etching solution), for example an acid aqueous solution containing phosphoric acid ($H_3PO_4$), nitric acid ($HNO_3$) and acetic acid ($CH_3COOH$) (FIG. 2B). Then the positive photoresist 106 is removed, for example, by the $O_2$ ashing method.

However, acid also etches the heating resistor layer 103 in the above-described example for producing a resistor, that is, the heating resistor layer 103 ($HfB_2$) is etched, and the resistance value of the resistor changes. The change in resistance could cause problems such as a decreased yield or reduced reliability of the thin film resistor.

According to these steps, electrodes are formed at desired intervals on the heating resistor layer 103. The insulating protective layer is thereafter formed by depositing an insulating layer such as $SiO_2$ in the film-forming apparatus.

The heating resistor heats, because the heating resistor layer 103 between electrodes heats when a current is supplied to the wiring electrode layer 104.

The film-forming apparatus has a film-forming chamber, in which the thin film resistor having the above-described film layer structure is produced. Since film formation is carried out repetitively in the film-forming chamber, a film-forming material is likely to deposit not only on the substrate, but also on the interior wall of the film-forming chamber. When the thickness of film deposited on the interior wall exceeds a certain level, it begins to exfoliate because it has a different thermal expansion coefficient from the interior wall of the film-forming chamber, or due to membrane stress within the film itself. This causes defects such as pinholes on the device (resistor), and in turn results in lower yields. Therefore, the interior of the film-forming chamber must be cleaned before film exfoliation starts. For example, in the case of $SiO_2$, cleaning is normally necessary before the cumulative film thickness reaches 50 $\mu$m.

In some cases, the film-forming apparatus is provided with a particle prevention plate as particle prevention means therein in order to reduce or prevent the deposition of film-forming material in undesired portions inside the apparatus.

In more detail, the wall surface of the film-forming chamber is covered by a plate of aluminum or stainless steel and the prevention plate is changed for a different one when removal of deposited film is necessary on the wall surface of the film-forming chamber. Cleaning could therefore be simplified.

However, to change the particle prevention plate in the film-forming apparatus for a different one, the vacuum in the film-forming chamber is inevitably broken and a lot of time is necessary to re-start the film-forming apparatus after the exchange of plates. Thus, such a method had various problems, for example, a drop of operating efficiency, a long evacuation time after the interior of the film-forming apparatus is exposed to the atmospheric pressure, causing water or gas to stick to the interior walls, or an unstable film-forming speed due to residual gas. In contrast, if the cleaning frequency is lowered, the yield is reduced due to formation of particles (dust).

SUMMARY OF THE INVENTION

The present invention takes the above problems into account. It is an object of the present invention to provide a method to produce a thin film resistor, which can avoid unnecessary etching of the heating resistor layer to cause no or little change in the resistance of the thin film resistor and to improve the yield and the reliability of a thin film resistor.

It is another object of the present invention to provide a method for producing a thin film resistor, which can readily produce a thin film resistor having stable heating properties, so that a liquid jet head having the thin film resistor can have stable ejection properties and high reliability.

It is still another object of the present invention to improve the particle prevention plate provided in the film-forming apparatus and thereby to provide a particle prevention plate which can reduce the amount of time to exchange particle prevention plates and a film-forming apparatus having such particle prevention plates.

It is a further object of the present invention to provide a particle prevention plate which can keep the deposit from dropping off even if more deposit is formed than the amount conventionally formed on the particle prevention plate, and a film-forming apparatus having such a particle prevention plate.

It is a still further object of the present invention to provide a particle prevention plate which can reduce the number of exchange times so as to improve the operating efficiency of a film-forming apparatus and which can improve the yield of film formation, and a film-forming apparatus having the particle prevention plate. It is another object of the present invention to provide a method for producing a thin film resistor, which comprises a wiring material formed on a heating resistor material with the wiring material being a material containing aluminum as a main component. The method includes a step of etching the wiring material to perform patterning in a desired layout, where the wiring material is etched by an alkaline aqueous solution.

It is another object of the present invention to provide a particle prevention plate in a film-forming chamber of a film-forming apparatus capable of forming a thin film, which has a tongued-and-grooved pattern on the surface thereof, and a film-forming apparatus which can be used for forming a thin film and on at least a portion of the surface of the inner wall of which a tongued-and-grooved pattern is formed.

BRIEF DESCRIPTION OF THE DRAWINGS

FIG. 1 is a schematic cross section to illustrate an example of a base for a thin film resistor;

FIGS. 2A to 2C are schematic cross sections to illustrate an example of a method for producing a base for a conventional thin film resistor;

DETAILED DESCRIPTION OF THE PREFERRED EMBODIMENTS

The embodiments of the present invention will be described with reference to the accompanying drawings when necessary.

The method for producing a thin film resistor according to the present invention, achieving the above objects, employs an etchant of alkaline aqueous solution as an etchant for etching a wiring material.

This can avoid unnecessary etching of the heating resistor layer so as to effect patterning only on the wiring material in a desired layout.

In this case, the wiring material is preferably aluminum or an alloy containing aluminum as a component. Among others, the wiring material is preferably aluminum or an alloy containing aluminum as a main component. In the case where the alloy containing aluminum as a main component, aluminum is contained preferably in an amount of at least 70% by weight, more preferably in an amount of at least 80% by weight, or further more preferably in an amount of at least 93% by weight. This rate may be changed depending upon the properties of etchant to be used.

In the present invention, the material for the resistor may be any material which can be etched by an acid aqueous solution but cannot be etched by an alkaline aqueous solution. The material may be hafnium, zirconium, nickel, gold, silver, iron, palladium, silicon, tantalum, titanium, niobium, cobalt, indium, alloys thereof or compounds containing them, for example, hafnium boride, zirconium boride, tantalum natiride, and tantalum aluminum. The particle prevention plate achieving the above objects has a tongued-and-grooved pattern on the surface thereof. This pattern forms continuous portions in shadow as seen from a target or evaporation source, on the particle prevention plate. A film is thus deposited on the particle prevention plate in a discontinuous manner (with no film stuck to the shadow portions), thereby relaxing the membrane stress and delaying the start of film exfoliation. The tongued-and-grooved pattern is preferably formed normally at a pitch in the range of about 1 to 50 mm on the surface of the particle prevention plate.

In the present invention, the expression that a deposited film is discontinuous means that a film is interrupted, if partially, or the particle prevention plate or the film-forming chamber wall appears, but the term "continuous" means that a deposited film is substantially formed all over the surface without interruption.

Also, the present invention can provide a particle prevention plate for a film-forming apparatus such as a sputtering apparatus or a vapor-deposition apparatus, which can prevent the yield from dropping due to particles even with lowered frequency of cleaning the film-forming chamber.

Figure 10A:
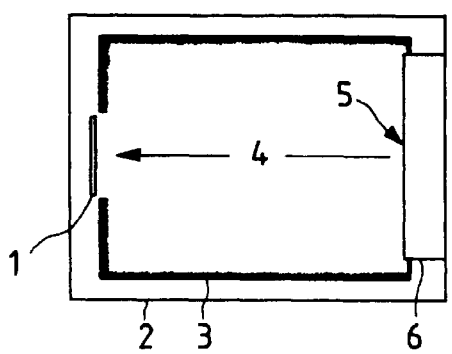
FIGS. 10A and 10B, FIGS. 12A and 12B, FIGS. 13A and 13B, and FIGS. 15A to 15C are schematic illustrations respectively to illustrate a particle prevention plate and a film-forming apparatus according to the present invention.

Incidentally, the sputtering (as shown in FIG. 10A) is such a phenomenon that when accelerated high-energy particles 5 are made to collide with the target 6, atoms or molecules in the target exchange momentum with the high-energy particles so as to be released into the space (as target atoms or molecules 4).

The sputtering apparatus is an apparatus utilizing this phenomenon to perform film formation by depositing a thin film on a substrate. When a film is formed using the sputtering apparatus, a film-forming material is deposited not only on the substrate but also on the particle prevention plate, substantially in the same film thickness. For example, in the case of $SiO_2$, assuming a film is formed in a thickness of 1 μm per cycle, the particle prevention plate must be exchanged for another before 50 cycles (before the cumulative film thickness exceeds 50 μm) but the present invention can extend the time for exchange.

Figure 13A:
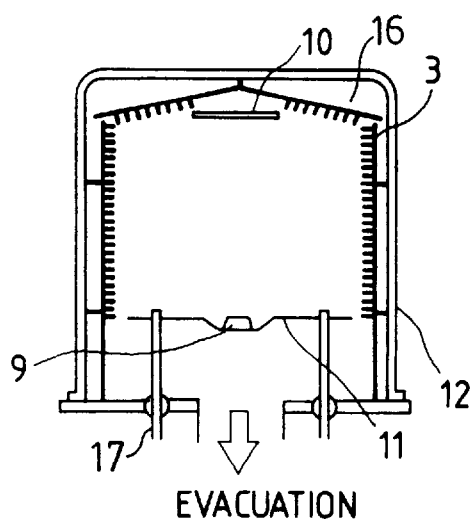

The vapor-deposition apparatus (as shown in FIG. 13A) forms a film such that a metal or insulator (evaporation source) 9 is heated in vacuum (by resistive heating element 11). Thus evaporating particles are made to be deposited on the substrate 10.

The vapor-deposition apparatus may employ the same structure for the particle prevention plate in the film-forming chamber as in the sputtering apparatus, in which discontinuous portions are provided on the particle prevention plate as being in shadow as seen at the evaporation source. Then a film is deposited on the particle prevention plate in a discontinuous manner, which can relax the membrane stress and delay the beginning of film exfoliation.

Now, the present invention will be further described in detail with various examples, but it should be noted that the present invention is not intended to be limited to the examples.

EXAMPLE 1

Figure 3A:
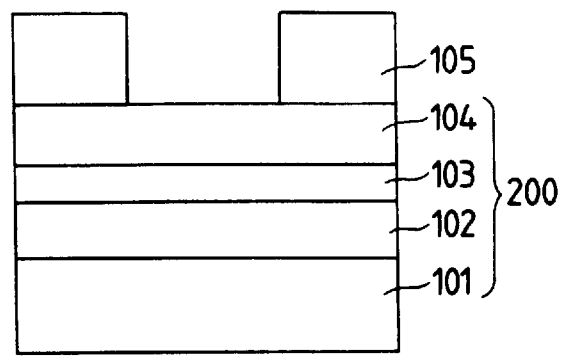
FIGS. 3A to 3C are schematic cross sections to illustrate an example of a method for producing a base for a thin film resistor according to the present invention.
Figure 3B:
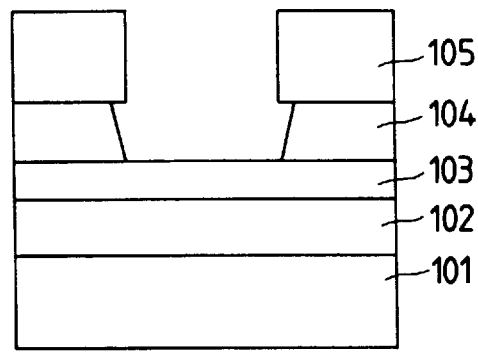
Figure 3C:
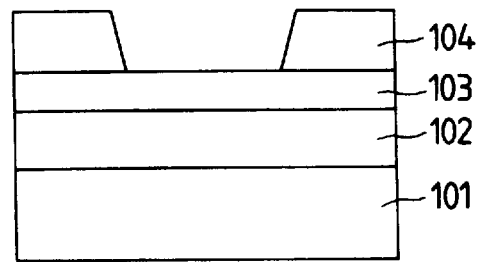

FIGS. 3A to 3C are schematic cross sections to show a method for producing a wiring part in a base for a recording head according to the present invention. In FIGS. 3A to 3C, reference numeral 200 denotes a part of the base for a recording head and 101 to 104 are the same as those as shown in common in FIGS. 2A to 2C, 3A to 3C, and 4A to 4C.

In FIGS. 3A to 3C, the recording head base 200 was formed such that a film of silicon oxide was formed as a heat storage layer 102 on a substrate 101 by the thermal oxidation, the CVD (vapor-deposition) method or the sputtering method. Thereafter hafnium boride ($HfB_2$) and aluminum (Al) were consecutively deposited on the heat storage layer 102 by sputtering or vapor deposition to form a heating resistor layer 103 of $HfB_2$ and a wiring electrode layer 104 of Al, respectively.

Then utilizing photolithography technology, the Al layer 104 deposited over the entire surface was coated by a negative photoresist 105 (for example OMR-83 supplied from TOKYO OHKA KOGYO CO., LTD.) in a thickness of 1 $\mu$m and patterning was carried out for forming electrodes (see FIG. 3A). The reason why the negative photoresist is used herein is that a positive resist would dissolve in some alkaline aqueous solutions before etching is completed.

Then the Al layer 104 was etched by an alkaline aqueous solution (for example alkaline aqueous solution containing KOH, HaOH or ethylenediamine) (see FIG. 3B). In this case, over-etching did not result in etching $HfB_2$ of the ground heating resistor layer 103. Subsequently, the negative photoresist 105 was removed by $O_2$ ashing, for example (see FIG. 3C).

As described above, etching the Al layer 104 using the alkaline aqueous solution, only the Al layer was selectively etched independent of $HfB_2$ of ground heating resistor layer 103. Table 1 shows the Al etching rate and selectivity to $HfB_2$ for each case of etching with the alkaline aqueous solution containing KOH and etching with the conventional acidic aqueous solution.

TABLE 1

| Etchant | Al Etch Rate | Selectivity to $HfB_2$ |
|---|---|---|
| Alkaline Aq. Sol. containing KOH | 240 nm/min | 0 |
| Acidic Aq. Sol. ($H_3PO_4$ + $HNO_3$ + $CH_3COOH$) | 259 nm/min | x |

TABLE 1-continued

| Etchant | Al Etch Rate | Selectivity to $HfB_2$ |
|---|---|---|

*Selectivity: 0-selectivity, yes; x-selectivity, no (i.e., $HfB_2$ is etched)
*Temperature of solution: 23° C. in case of alkaline aqueous solution; 40° C. in case of acidic aqueous solution
*KOH was a 40% aqueous solution thereof.

A recording head was produced by use of the base produced according to the above steps and subjected to recording tests. The test results showed that such a recording head was able to perform stable ejection of ink for a long duration.

EXAMPLE 2

Figure 4A:
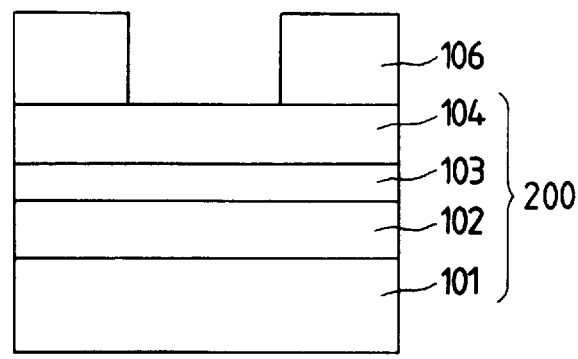
FIGS. 4A to 4C are schematic cross sections to illustrate another example of a method for producing a base for a thin film resistor according to the present invention.
Figure 4B:
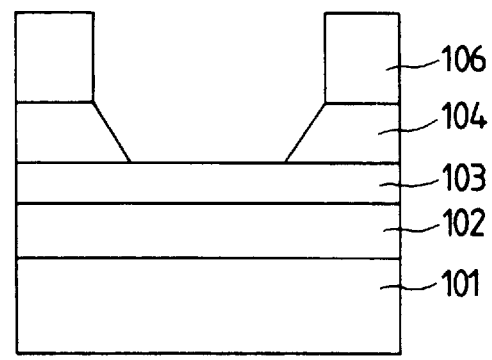
Figure 4C:
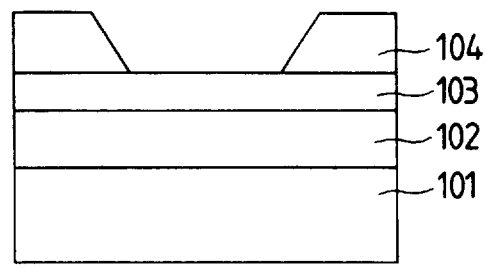

FIGS. 4A to 4C are schematic cross sections to illustrate another example of the method for producing a base for recording head according to the present invention. A part 200 of base for recording head used the same as the base in Example 1 (FIGS. 3A to 3C). Utilizing photolithography technology, the part 200 of recording head base was coated by a positive photoresist 106 (for example OFPR-800 supplied from TOKYO OKKA KOGYO CO., LTD.) in a thickness of 2 $\mu$m on the Al layer 104 deposited over the entire surface of base, and patterning was carried out for formation of wiring and electrodes (see FIG. 4A).

Then the Al layer 104 was etched by a 2.38% aqueous solution of tetramethylammonium hydroxide (see FIG. 4B). This aqueous solution can be used as a developer for the photoresist, so that the positive resist does not dissolve therein even if the etchant is an alkaline aqueous solution. Also, when the etchant is used as a developer for the photoresist, development of resist can be effected at the same time as the etching of Al, obtaining tapered edges of Al layer and thereby improving coverage of the protective film.

It should be carefully controlled that tetramethylammonium hydroxide is kept up to 3.5%, because the resist could dissolve therein in concentration of above 3.5%. Also, in this case, over-etching did not result in etching $HfB_2$ of the ground heating resistor layer 103. Then the positive photoresist 106 may be removed by $O_2$ ashing (see FIG. 4C).

As described above, the Al layer 104 could also be etched using the tetramethylammonium hydroxide aqueous solution which was an alkaline aqueous solution, while only the Al layer was selectively etched independent of $HfB_2$ of ground heating resistor-layer 103. Table 2 shows an etch rate of Al and a selectivity to $HfB_2$ for each case of etching with the etchant in this example and etching with the conventional acidic aqueous solution.

TABLE 2

| Etchant | Al Etch Rate | Selectivity to $HfB_2$ |
|---|---|---|
| 2.38% Aq. Sol. of Tetramethylammonium hydroxide | 70 nm/min | 0 |
| Acidic Aq. Sol. ($H_3PO_4$ + $HNO_3$ + $CH_3COOH$) | 259 nm/min | x |

*Selectivity: 0-selectivity, yes; x-selectivity, no (i.e.; $HfB_2$ is etched)
*Temperature of solution: 40° C. for the developer and for the acidic aqueous solution.

A recording head was produced by use of the base thus produced in this example and subjected to a drive test.

The test results showed that the recording head was able to perform stable recording for a long duration.

EXAMPLE 3

FIGS. 5A to 5D are schematic cross sections to illustrate still another example of the method for producing the base for a recording head according to the present invention. A part 200 of the base for recording head was the same as used in Example 1 (FIGS. 3A to 3C). Using photolithography technology, the part 200 of the recording head base was coated by a positive photoresist 106 in a thickness of 2 μm on the Al layer 104 deposited over the entire surface of base, and patterning was carried out for forming electrodes (see FIG. 5A).

Figure 5A:
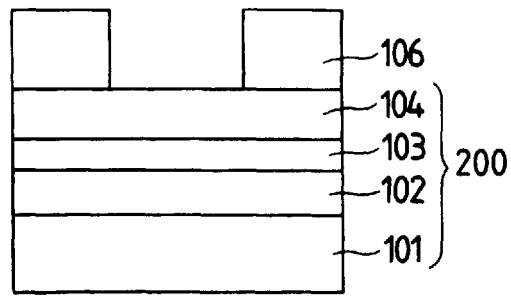
FIGS. 5A to 5D are schematic cross sections to illustrate another example of a method for producing a base for a thin film resistor according to the present invention.
Figure 5B:
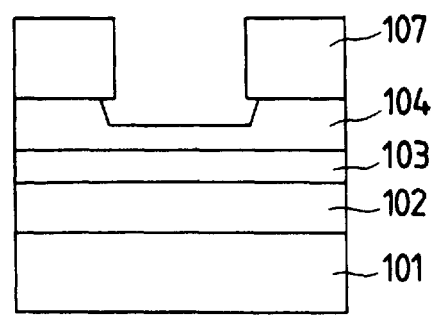

Then the Al layer 104 was etched half by an etchant for Al (acidic aqueous solution) (see FIG. 5B). The reason why the Al layer was first half-etched is that a tetramethylammonium hydroxide aqueous solution for the next process has a slow etch rate of Al, which lowers the processing rate. Therefore the drop in processing capability is compensated for by the half etching of Al with the acidic aqueous solution having a faster etch rate.

Figure 5C:
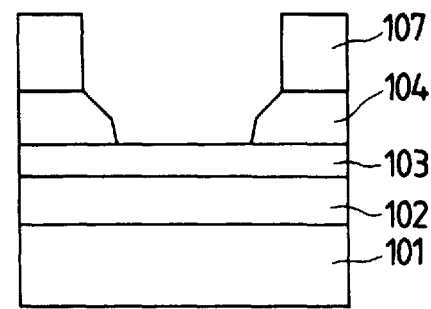
Figure 5D:
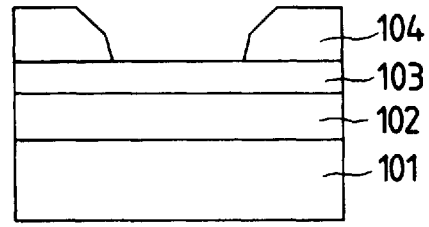

Then the Al layer 104 was completely etched by 2.38% aqueous solution of tetramethylammonium hydroxide (see FIG. 5C). Further, the positive photoresist 106 was removed by the $O_2$ ashing for example (see FIG. 5D).

Although this etching method has a slower processing speed than the etching in Example 1 only with the alkaline aqueous solution, it has better coverage of protective film because of the tapered upper edges of Al layer. Also, in the case the alkaline aqueous solution with slower etching rate of Al is used as in Example 2, the half etching with acid aqueous solution is effective.

In the above process, the Al layer 104 was etched half by the acidic aqueous solution and thereafter further half by the tetramethylammonium hydroxide aqueous solution which was the alkaline aqueous solution, whereby only the Al layer was able to be selectively etched without etching the $HfB_2$ of heating resistor layer 103, that is, independent of $HfB_2$.

EXAMPLE 4

Liquid jet heads were produced by use of the methods for producing the thin film resistor as described above with Examples 1 to 3, and properties thereof were investigated. First described are the structure and the principle of a liquid jet head employed in this example. The structure and the principle are preferably based on the basic principle as disclosed for example in U.S. Pat. No. 4,723,129 or No. 4,740,796. This method can be applicable to either of the so-called on-demand type or continuous type. This method is suitable in particular for cases of on-demand type, because the overall apparatus can be constructed in a compact size.

This method is briefly described as follows. An electro-thermal converter is arranged to correspond with a sheet or a liquid conduit in which a liquid (ink) is kept. The electrothermal converter generates thermal energy when at least one drive signal corresponding to recording information, which can cause a rapid temperature rise over the nuclear boiling, is applied to the electrothermal converter. This thermal energy causes film boiling on the thermal action surface of the liquid jet head (as will be referred to as "recording head"), resulting in the formation of a gas bubble in the liquid in one-to-one correspondence with the recording signal. The liquid is ejected through a discharge opening upon growth and constriction of this bubble so as to form at least one drop. Employing a pulse signal as the drive signal, the growth and constriction of the bubble can be made quickly and properly, so that the liquid ejection excellent especially in responsiveness can be achieved.

The pulse drive signal is preferably one as described in U.S. Pat. No. 4,463,359 or No. 4,345,262. Better recording can be carried out employing the conditions described in U.S. Pat. No. 4,313,124 disclosing the invention concerning the temperature rise rate of the above thermal action surface. The recording head construction may be one as described in U.S. Pat. No. 4,558,333 or No. 4,459,600 each disclosing the arrangement in which the thermal action surface is set in a bent region, as well as the constructions of combination of discharge port, liquid conduit and electrothermal converter (including a linear liquid conduit or liquid conduit having a bent portion) as described in the specifications of the patents listed above. In addition, a plurality of electrothermal converters may be effectively constructed employing the construction based on Japanese Laid-open Patent Application No. 59-123670 disclosing the arrangement of a common slit as a discharge portion of liquid or Japanese Laid-open Patent Application No. 59-138461 disclosing the arrangement in which an aperture for absorbing pressure waves of thermal energy is employed as a discharge portion.

Further, the recording head may be one of full-line type having a length corresponding to the maximum width of recording medium in which the recording apparatus can perform recording. In this case, the length may be attained by combining a plurality of recording heads as described in the above specifications or by a single recording head integrally formed.

Additionally, a preferable recording head may be one of an interchangeable chip type which, upon mounting onto the main body of an apparatus, can be electrically connected to the main body of an apparatus can receive supply of ink from the main body of the apparatus, or one of a cartridge type in which electrical connections and an ink tank are integratedly incorporated.

Also, recovery means or preliminary helping means may be preferably added to the recording head as a component in an information processing apparatus according to the present invention, thereby making the apparatus further maintenance free.

Specifically, effective means for stable recording added to the recording head are capping means, cleaning means, pressurizing or sucking means, warming means for warming the recording head, such as the electrothermal converter, or a pre-ejecting mode for different ejection from recording.

Further, the recording made may be one with only a main color such as black, or one with multicolors or full colors different from each other, using an integral recording head or a combination of plural recording heads.

Although the above description concerns only the examples using the liquid (ink), the ink may be a solid ink at room temperature or ink softening at room temperature. Since the above ink jet method is generally carried out under such a temperature control that the ink itself is adjusted in the temperature range of 30° C. to 70° C. to keep the viscosity of the ink in a stable ejection range, any ink may be employed as long as it is in a liquid state upon application of the recording signal employed. In addition, the ink may be one turning from a solid state to a liquid state with a temperature rise caused by positively supplying thermal energy.

Next described briefly is an ink jet recording head used in the recording method to eject a liquid by utilizing the thermal energy as described.

Figure 6:
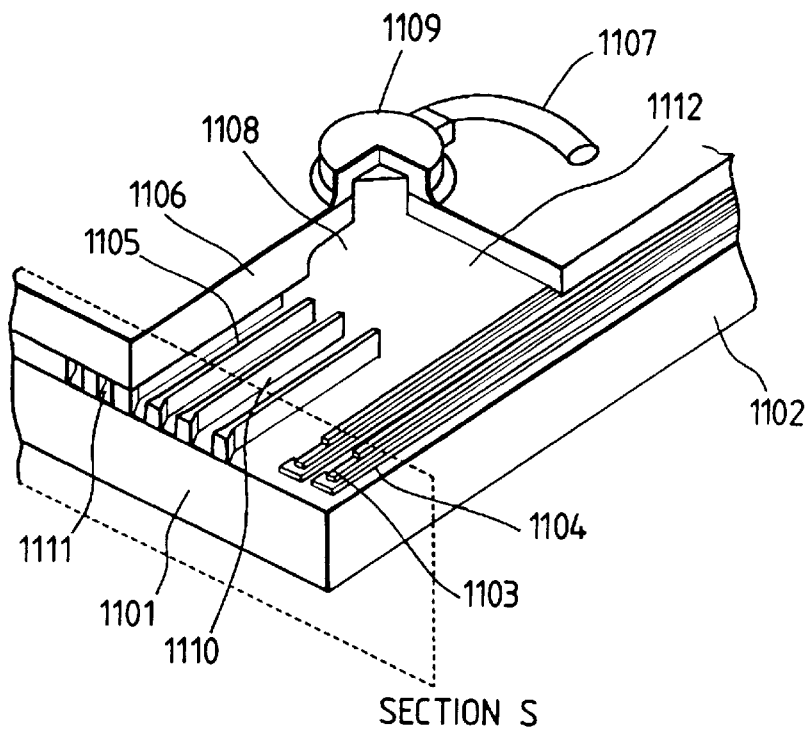
FIG. 6 is a schematic perspective view to illustrate an example of an ink jet recording head to which the thin film resistor of the present invention can be applied.

FIG. 6 is a schematic drawing of an example of an ink jet recording head utilizing thermal energy. FIG. 6 shows an ink jet recording head composed of electrothermal converters 1103, electrodes 1104, liquid conduit walls 1105 and a top plate 1106, which are formed on a substrate 1102 through the semiconductor fabrication process such as the etching, the vapor deposition, the sputtering and the like. A liquid 1112 for recording is supplied from an unrepresented liquid storage tank to a common liquid chamber 1108 in the recording head 1101 through a liquid supply tube 1107. In FIG. 6, numeral 1109 denotes a connector for the liquid supply tube.

The liquid 1112 supplied into the common chamber 1108 is then supplied into each liquid conduit 1110 by the so-called capillarity, and kept therein as forming a meniscus on the surface of discharge port (orifice) at the distal end of each liquid conduit. When a current is supplied to an electrothermal converter 1103 in this state, the liquid is steeply heated on the electrothermal converter to form a bubble in a liquid conduit. Inflation and contraction of the bubble ejects the liquid from a discharge port 1111 to form a liquid drop.

The above arrangement permits discharge ports to be aligned at a high density, over 16 nozzles/mm. Therefore, an ink jet head may have 128 discharge ports or 256 discharge ports at such high density. Further, the above arrangement permits an ink jet head of full-line type in which discharge ports are aligned along the entire recording width at the high density.

Figure 7:
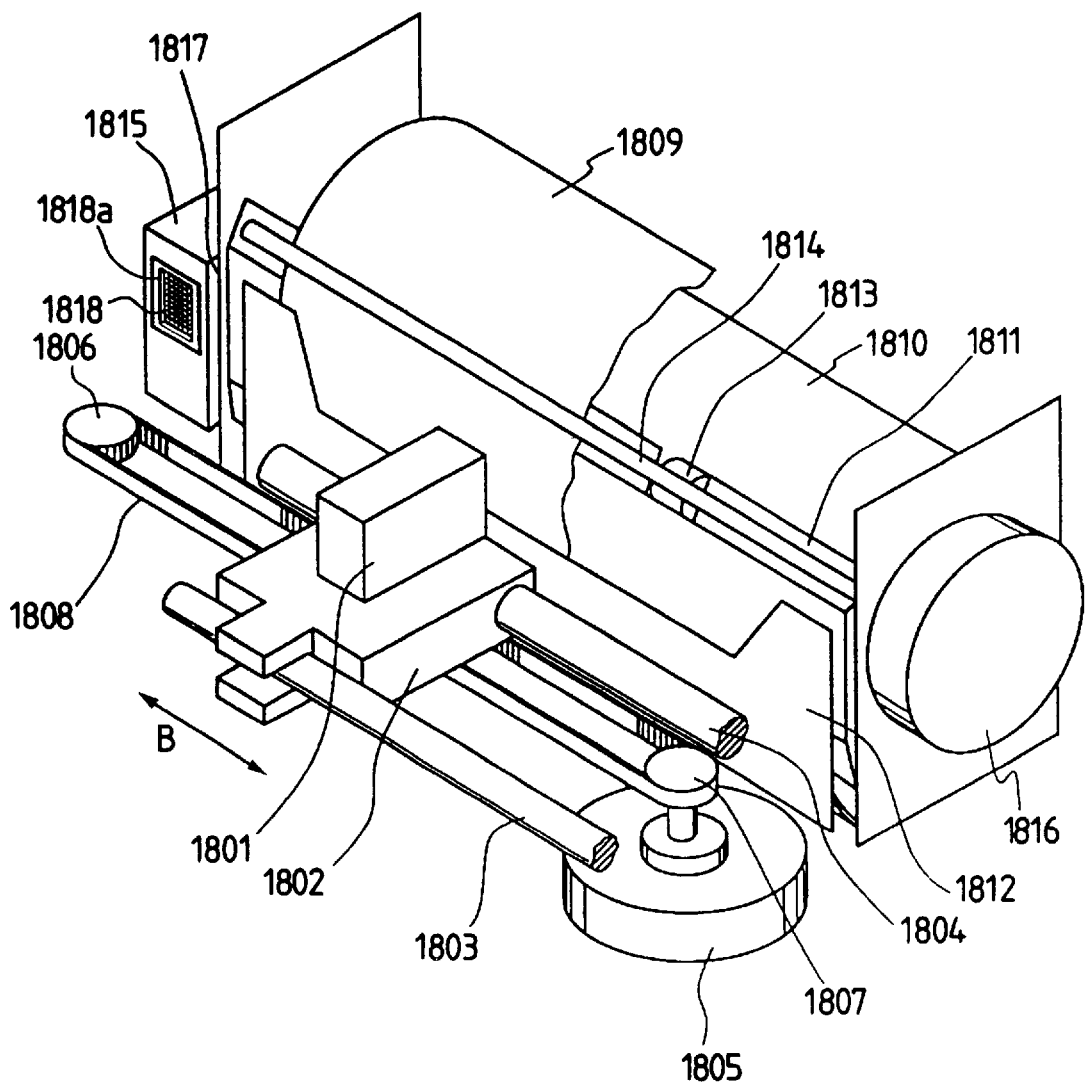
FIG. 7 is a schematic perspective view to illustrate an example of a recording portion using the ink jet recording method, to which the thin film resistor of the present invention can be applied.

FIG. 7 is a perspective view to show the scheme of external construction of the output portion using the ink jet recording method. In FIG. 7, 1801 is an ink jet recording head (hereinafter referred to as a recording head) for ejecting ink based on a predetermined recording signal to record a desired image, and 1802 a carriage for scan-moving the recording head 1801 in the recording direction designated by B in FIG. 7 (in the main scanning direction). The carriage 1802 is slidably supported by guide shafts 1803, 1804 so as to reciprocate in the main scanning direction synchronized with a timing belt 1808. The timing belt 1808 is engaged with pulleys 1806, 1807 and is driven by a carriage motor 1805 through the pulley 1807.

A recording sheet 1809 is guided by a paper pan 1810 and is carried by an unrepresented sheet-feed roller in press contact with a pinch roller.

This carriage is carried out by a sheet-feed motor 1816 as a drive source. The conveyed recording sheet 1809 is under a tension between a discharge roller 1803 and spur 1814 and is further conveyed as kept in close fit with a heater 1811 by a sheet press plate 1812 made of an elastic material. The recording head 1801 ejects ink onto the recording sheet 1809, and the recording sheet 1809 with ink sticking thereto is heated by the heater 1811, whereby the sticking ink is fixed on the recording sheet 1809 by evaporation of water therein.

Numeral 1815 denotes a unit called a recovery system, which removes foreign materials or ink with increasing viscosity sticking to the discharge ports (not shown) in the recording head 1801 so as to maintain the ejection properties in a normal condition.

Numeral 1818a is a cap constituting a part of the recovery system unit 1815, which caps the discharge ports in the recording head 1801 to prevent occurrence of plugging. An ink absorber 1818 is preferably set inside the cap 1818a.

Also, a blade 1817 is provided on the recording region side of the recovery system unit 1815 in order to clean foreign materials or ink sticking to the surface of discharge ports while contacting the surface in which the discharge ports are formed in the recording head 1801.

Figure 8:
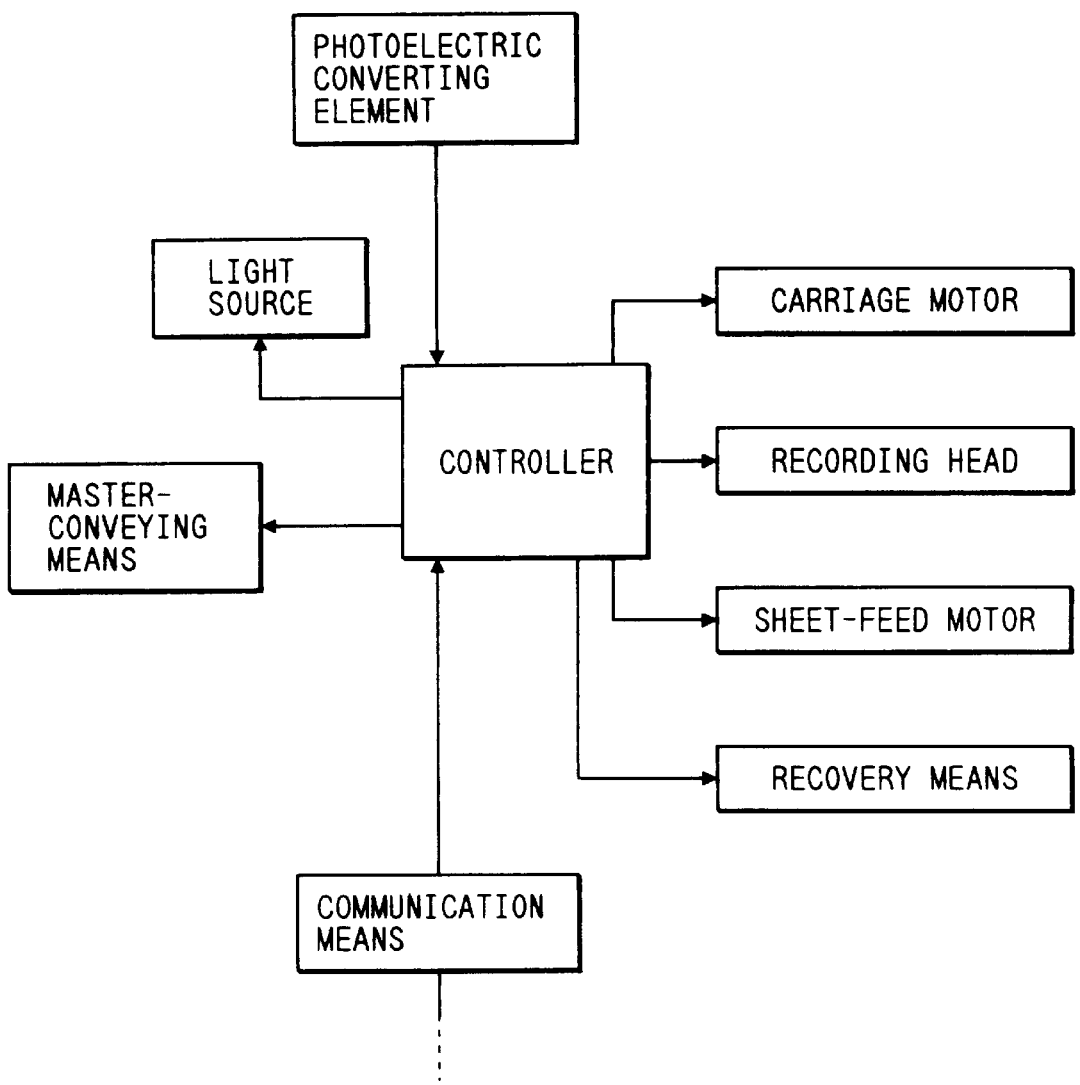
FIG. 8 is a block diagram to illustrate an example of construction of an information processing apparatus to which the recording head of the present invention is applied.

In the present invention, recording is carried out as shown in the block diagram in FIG. 8. A photoelectric converter reads image information in the form of electric signals. An image processor converts the thus read electric signals carrying the image information into electric signals for recording. A controller such as a CPU (central processing unit) controls the carriage motor, the sheet-feed motor, the recovery system and other elements to carry out recording.

The electric signals carrying the image information may be transmitted through a communication means to another image processor to be output therefrom, or information may be received from another information processor through the communication means to carry out recording by the above recording head.

In this example, recording heads were produced using the parts 200 of the base produced in Examples 1–3 with 128 discharge ports at a setup density of 16 nozzles/mm. Continuous ejection was carried out for each of the recording heads.

The test results showed no significant difference in ejection properties between discharge ports or between the recording heads in either one of the recording heads using the parts 200 of base. Also, all the recording heads using the parts of base obtained in the examples were able to perform stable recording for a long duration.

Figure 9:
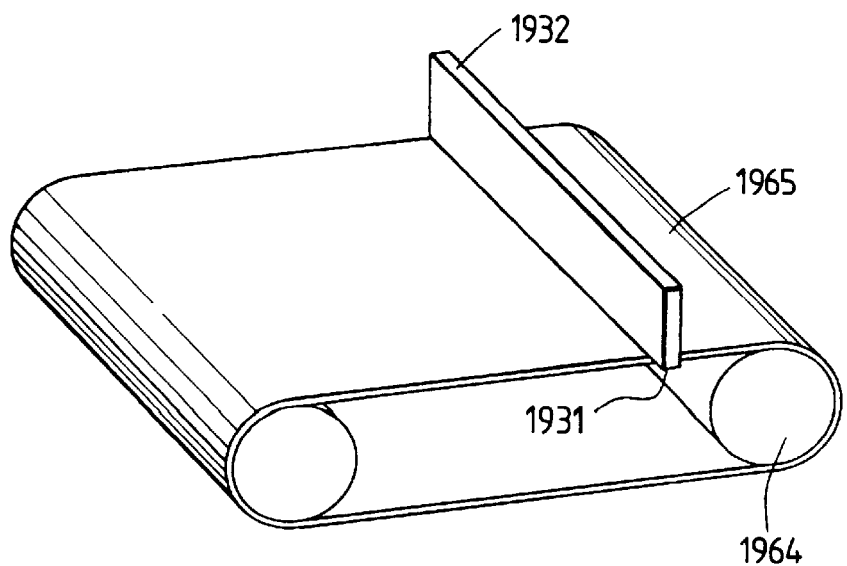
FIG. 9 is a schematic perspective view to show an example of a recording portion using the ink jet recording method, to which the information processing apparatus of the present invention can be applied.

Next shown in FIG. 9 is the scheme of an output portion in case of a recording head 1932 of full-line type being mounted.

In FIG. 9, 1965 represents conveying belt for conveying a recording medium, which conveys an unrepresented recording medium with rotation of a convey roller 1964. The bottom surface of recording head 1932 is a discharge port surface 1931 in which a plurality of discharge ports are aligned corresponding to a recording region on the recording medium.

Excellent recording was made also in this case similarly as in the case of serial type as described before.

In the present invention, the alkaline aqueous solution is preferably an aqueous solution containing at least one substance selected from KOH, NaOH, ethylenediamine, and tetramethylammonium hydroxide, as described before, and in addition a pH controller or a surfactant may of course be added thereto, if necessary.

EXAMPLE 5

Figure 10B:
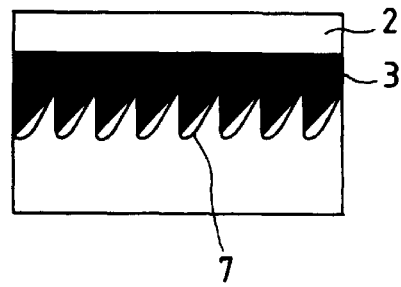
Figure 11:
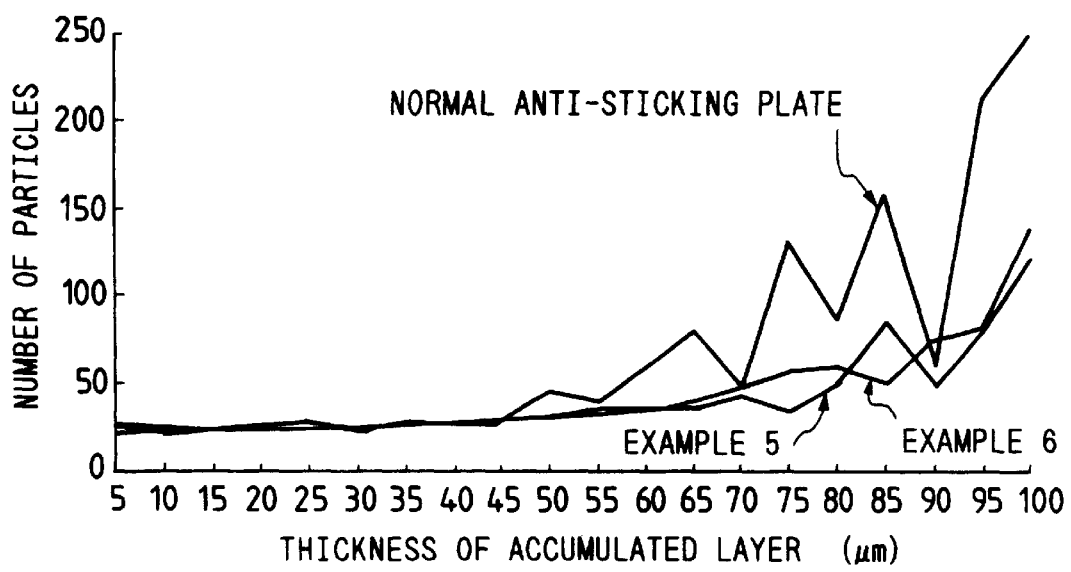
FIG. 11 and FIG. 14 are graphs to show test results for explaining the effect of the present invention.

FIG. 10A schematically shows a sputtering apparatus as a vacuum film-forming apparatus equipped with a particle prevention plate, which is the particle prevention plate for film-forming apparatus according to the present invention. In this drawing, 1 represents a substrate, 2 is a film-forming apparatus wall, 3 is a particle prevention plate, 4 is a flying direction of target atom or molecule, 5 is a flying direction of high-energy particles, and 6 represents a target. As shown in FIG. 10A, the particle prevention plate 3 of this example has a sawtooth cross section. In this example, a test was conducted with a film-forming apparatus in which a particle prevention plate 3 was arranged around the sideface and a substrate 1. FIG. 10B is a partially enlarged cross section for illustrating the deposition of film on the particle prevention plate 3. Numeral 7 denotes a film-forming material deposited on the particle prevention plate 3. As shown in FIG. 11, production of particles was remarkably reduced in sputtering by use of a film-forming apparatus equipped with a particle prevention plate 3 having a sawtooth cross section as compared to film formation with a normal particle prevention plate having no tongued-and-grooved pattern.

EXAMPLE 6

Figure 12A:
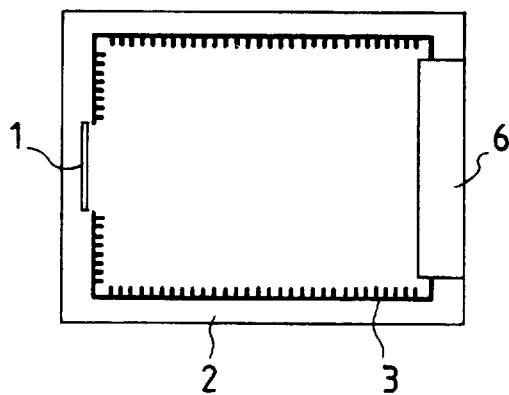
Figure 12B:
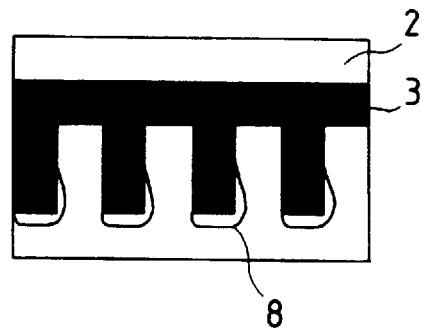

FIG. 12A shows a sputtering apparatus similar to the above, in which a particle prevention plate has a tongued-and-grooved pattern in rectangular cross section different from that in FIG. 10A. The purpose of the pattern is the same as that in Example 5. FIG. 12B is a partially enlarged cross section of the particle prevention plate to show a state of film deposition, in which numeral 8 designates a film-forming material deposited thereon. The numerals in FIGS. 12A and 12B represent the same numerals as in FIGS. 10A and 10B. As shown in FIG. 11, with the particle prevention plate of rectangular cross section, very stable film formation was made as the production of particles did not steeply increase even with an increase in film thickness.

EXAMPLE 7

Figure 13B:
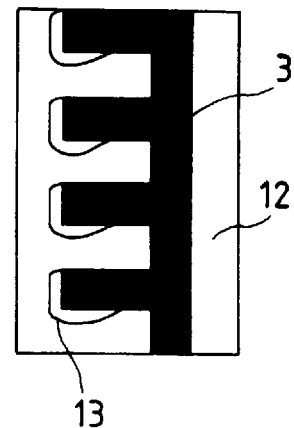

FIG. 13A schematically shows a cross section of a vapor-deposition apparatus as a vacuum film-forming apparatus equipped with a particle prevention plate being the particle prevention plate for a film-forming apparatus according to the present invention. In this drawing, 9 is an evaporation source, 10 is a substrate, 11 is a heating means and 12 is a wall of film-forming chamber. A gap 16, exists between the particle prevention plate 3 and the inner wall of the film-forming chamber, 12. Supports 17 hold the heating means 11. The supports 17 and the heating means 11 constitute an arranging portion for arranging the starting material source 9 thereon. The particle prevention plate has a tongued-and-grooved pattern comprising a plurality of tongued portions formed at a pitch of 1 to 50 mm. The tongued portions of the tongued-and-grooved pattern are provide such that each grooved portion between two adjacent tongued portions has a shape corresponding to the shape of the tongued portions, or the tongued portions are positioned to be apart from each other by a distance not smaller than the thickness of each of the tongued portions. Further, the tongued portions each have a first portion opposite to the arranging portion and a second portion which is not opposite to the arranging portion, such that a material from the starting material source is not deposited continuously on the tongued-and-grooved pattern. As shown in FIG. 13A, the particle prevention plate 3 in this example has a rectangular cross section. In this example, a test was conducted with a film-forming apparatus in which the particle prevention plate 3 was arranged around the side face of the film-forming apparatus and a substrate 10. FIG. 13B is a partially enlarged cross section for illustrating the deposition of film on the particle prevention plate 3. Numeral 13 denotes a film-forming material deposited on the particle prevention plate 3.

Figure 14:
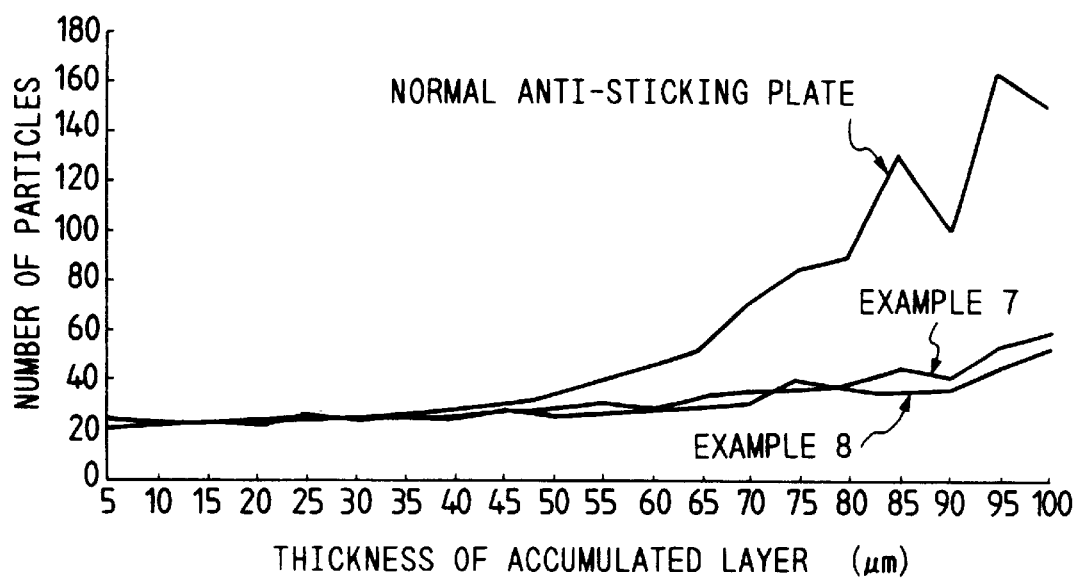

FIG. 14 shows the result of film formation with an apparatus having the particle prevention plate. As shown in FIG. 14, only a very small amount of particles were produced with increased film thickness on the particle prevention plate in this example.

EXAMPLE 8

Figure 15B:
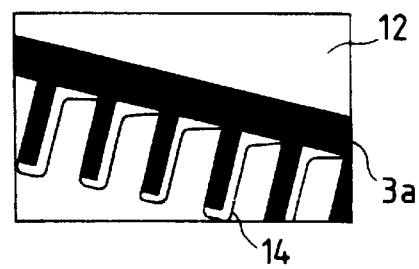
Figure 15A:
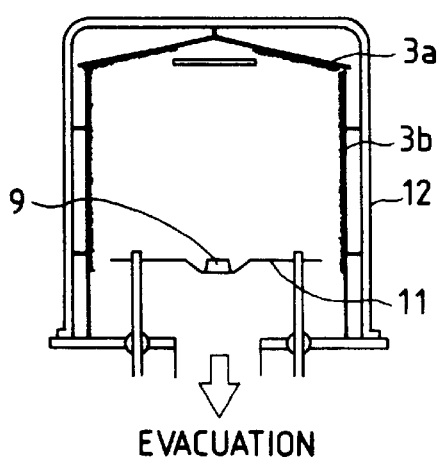
Figure 15C:
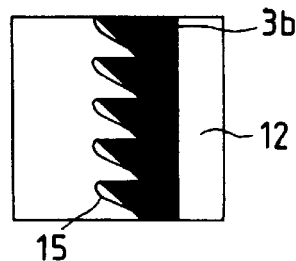

FIG. 15A schematically shows a cross section of a vapor-deposition apparatus as a vacuum film-forming apparatus equipped with a particle prevention plate being the particle prevention plate for film-forming apparatus according to the present invention. Numerals 3a and 3b represent particle prevention plates, respectively. This example used the combination of the particle prevention plate 3a having a rectangular cross section and the particle prevention plate 3b having a sawtooth cross section. FIGS. 15B and 15C are partially enlarged cross sections for illustrating the deposition of films on the particle prevention plates 3a and 3b, respectively. Numerals 14 and 15 denote film-forming materials deposited on the particle prevention plates 3a and 3b, respectively. In this example, the particle prevention plate 3a having a rectangular cross section was arranged around the substrate and the particle prevention plate 3b having a sawtooth cross section was arranged on the side wall of the film-forming chamber.

It is possible to reduce further the production of particles by changing the cross-section of the particle prevention plates and the location thereof.

FIG. 14 shows the result of film formation with an apparatus having the particle prevention plates as described above. As shown in FIG. 14, with the particle prevention plates the production of particles was very low with an increase in film thickness.

EXAMPLE 9

Using the film-forming apparatus with either of the particle prevention means as described in Examples 5–8, the heating resistor layer (HfB$_2$), the wiring material (Al) and the insulating protective layer (SiO$_2$) were formed and recording heads similar to those described in Example 4 were prepared. The recording properties of the recording heads were tested. In the test, no ejection trouble caused by particles was found.

Further, in the case where the methods as shown in Examples 1–3 were used for etching of the wiring material, recording heads were obtained with excellent ejection properties and durability. The following advantages can be attained if the wiring electrode layer containing aluminum as a main component is etched by the alkaline aqueous solution as described above. Since the resistor layer remains unetched, a resistor has less change in resistance, the yield is improved, the productivity is also improved, and the reliability of the thin film resistor is increased.

Also, by making discontinuous the film-forming material, which is deposited on the particle prevention plate in the film-forming chamber of the film-forming apparatus, the start time of film exfoliation can be delayed, which extends the cycle of cleaning for the particle prevention plate (by about 33% in the case of the sputtering apparatus and by about 60% in the case of the vapor-deposition apparatus). The elongated cleaning cycle results in increased yield due to the decreased film exfoliation.

Incidentally, each slant face of sawtooth depends upon an apparatus. Each slant face may be on the upper face side or on the lower face side. The slant face is preferably on the substrate side from the viewpoints of ease in breaking the deposit away from the particle prevention plate (on the interior surface of apparatus) and of ease in stopping exfoliating particles.

It should be noted that the present invention is not limited to the above examples but many modifications can be considered within the scope of the invention.

What is claimed is:

1. A film-forming apparatus which can be used in forming a thin film, comprising a chamber, an internal pressure of which can be reduced, an arranging portion for arranging thereon a starting material source to be arranged in the chamber, and a particle prevention plate provided on an inner surface of the chamber other than a surface which includes or is coplanar with the arranging portion, said particle prevention plate being arranged to provide a gap between the particle prevention plate and the inner surface of the chamber, wherein the particle prevention plate has a tongued-and-grooved pattern comprising a plurality of tongued portions formed at a pitch of 1 to 50 mm, wherein the tongued portions of the tongued-and-grooved pattern are provided such that each grooved portion between two adjacent tongued portions has a shape corresponding to the shape of the tongued portions, or the tongued portions are positioned to be apart from each other by a distance not smaller than the thickness of each of the tongued portions, and wherein the tongued portions each have a first portion opposite to the arranging portion and a second portion which is not opposite to the arranging portion, such that a material from the starting material source is not deposited continuously on the tongued-and-grooved pattern, and such that the material is deposited on the first portions and is not deposited on the second portions, whereby a deposited film is formed discontinuously on the particle prevention plate.

2. The film-forming apparatus according to claim 1, wherein the tongued portions of the tongued-and-grooved pattern each have a sawtooth shape, and wherein the slope portion of the sawtooth shape is opposite the starting material source.

3. A film-forming apparatus according to claim 1, wherein the tongued portions of the tongued-and-grooved pattern each have a sawtooth cross section.

4. A film-forming apparatus according to claim 1, wherein the tongued portions of said tongued-and-grooved pattern each have a rectangular cross section.

5. The film-forming apparatus according to claim 1, wherein the particle prevention plate is provided in plural number.

6. The film-forming apparatus according to claim 5, wherein the tongued portions of the plurality of particle prevention plates each have a sawtooth cross-section or a rectangular cross section.

7. A film-forming apparatus according to claim 1, wherein said film-forming apparatus is selected from a sputtering apparatus and a vapor-deposition apparatus.

* * * * *

UNITED STATES PATENT AND TRADEMARK OFFICE
CERTIFICATE OF CORRECTION

PATENT NO.     : 5,837,057
DATED          : November 17, 1998
INVENTOR(S)    : SHUJI KOYAMA ET AL.            Page 1 of 2

It is certified that error appears in the above-identified patent and that said Letters Patent is hereby corrected as shown below:

AT [56] REFERENCES CITED

FOREIGN PATENT DOCUMENTS

"4289159                --4-289159
　　1 130341" should read    1130341--

AT [56] REFERENCES CITED

Attorney, Agent, or Firm, "Fitzpatrick, Cell, Harper & Scinto" should read --Fitzpatrick, Cella, Harper & Scinto--.

COLUMN 3

Line 9, "It" should read --¶ It--.

COLUMN 4

Line 25, "The" should read --¶ The--.

COLUMN 6

Line 49, "resistor-layer" should read --resistor layer--.

COLUMN 7

Line 46, "First" should read --¶ First--; and
　Line 60, "nuclear" should read --nucleate--.

UNITED STATES PATENT AND TRADEMARK OFFICE
CERTIFICATE OF CORRECTION

PATENT NO.   : 5,837,057
DATED        : November 17, 1998
INVENTOR(S)  : SHUJI KOYAMA ET AL.

It is certified that error appears in the above-identified patent and that said Letters Patent is hereby corrected as shown below:

COLUMN 8

Line 34, "apparatus can" should read --apparatus, and can--.

COLUMN 11

Line 36, "provide" should read --provided--.

COLUMN 12

Line 36, "The" should read --¶ The--.

COLUMN 14

Line 16, "cross-section" should read --cross section--.

Signed and Sealed this

Eleventh Day of July, 2000

Attest:

Q. TODD DICKINSON

*Attesting Officer*                    *Director of Patents and Trademarks*